(12) United States Patent
Schwartz et al.

(10) Patent No.: US 9,564,894 B2
(45) Date of Patent: Feb. 7, 2017

(54) CAPACITIVE INPUT DEVICE INTERFERENCE DETECTION AND OPERATION

(75) Inventors: Adam Schwartz, Redwood City, CA (US); Tracy Scott Dattalo, Santa Clara, CA (US); Robin Hodgson, Los Gatos, CA (US)

(73) Assignee: Synaptics Incorporated, San Jose, CA (US)

( * ) Notice: Subject to any disclaimer, the term of this patent is extended or adjusted under 35 U.S.C. 154(b) by 282 days.

(21) Appl. No.: 13/240,377

(22) Filed: Sep. 22, 2011

(65) Prior Publication Data
US 2012/0262222 A1 Oct. 18, 2012

Related U.S. Application Data

(60) Provisional application No. 61/476,142, filed on Apr. 15, 2011.

(51) Int. Cl.
*G06F 3/041* (2006.01)
*G06F 3/044* (2006.01)
*H03K 17/96* (2006.01)

(52) U.S. Cl.
CPC .......... *H03K 17/9622* (2013.01); *G06F 3/044* (2013.01); *G06F 3/0418* (2013.01); *H03K 2217/960705* (2013.01)

(58) Field of Classification Search
CPC .............................. G06F 3/0418; G06F 3/044
USPC ................................. 178/18.05; 345/173–178
See application file for complete search history.

(56) References Cited

U.S. PATENT DOCUMENTS

| 7,876,311 | B2 | 1/2011 | Krah et al. |
| 8,004,305 | B2 | 8/2011 | Jenkins et al. |
| 8,239,784 | B2 | 8/2012 | Hotelling et al. |
| 8,314,779 | B2 | 11/2012 | Chan et al. |
| 8,576,161 | B2 | 11/2013 | Chang et al. |
| 8,643,624 | B2 | 2/2014 | Day et al. |
| 2003/0210235 | A1 | 11/2003 | Roberts |
| 2006/0026535 | A1* | 2/2006 | Hotelling ............ G06F 3/0418 715/863 |
| 2006/0227115 | A1 | 10/2006 | Fry |
| 2008/0157782 | A1 | 7/2008 | Krah |

(Continued)

OTHER PUBLICATIONS

Office Action, U.S. Appl. No. 13/434,713, mailed Mar. 7, 2014, 16 pages.

(Continued)

*Primary Examiner* — Temesghen Ghebretinsae
*Assistant Examiner* — Lisa Landis

(57) ABSTRACT

A processing system for a capacitive input device comprises sensor circuitry and control logic. The sensor circuitry is configured to be communicatively coupled with sensor electrodes of the capacitive input device. The control logic is configured to operate the capacitive input device in a first mode comprising interference sensing at a first level and input object sensing. The control logic is also configured to operate the capacitive input device in a second mode instead of in the first mode in response to: interference measured in the first mode meeting an interference condition; and a determination that input is in a sensing region of the capacitive input device. While operating in the second mode, interference sensing with the capacitive input device is either not performed or else is performed at a second level that is lower in fidelity than the first level.

20 Claims, 8 Drawing Sheets

(56) References Cited

U.S. PATENT DOCUMENTS

| | | |
|---|---|---|
| 2008/0158169 A1 | 7/2008 | O'Conner et al. |
| 2008/0162996 A1 | 7/2008 | Krah et al. |
| 2008/0309622 A1 | 12/2008 | Krah |
| 2008/0309628 A1 | 12/2008 | Krah et al. |
| 2009/0309625 A1 | 12/2009 | Jenkins et al. |
| 2010/0079401 A1 | 4/2010 | Staton |
| 2010/0110040 A1 | 5/2010 | Kim et al. |
| 2010/0214232 A1* | 8/2010 | Chan ............... G06F 3/044 345/173 |
| 2010/0238134 A1 | 9/2010 | Day et al. |
| 2010/0295824 A1 | 11/2010 | Noguchi et al. |
| 2010/0321305 A1* | 12/2010 | Chang ............ G06F 3/0412 345/173 |
| 2011/0025634 A1 | 2/2011 | Krah et al. |
| 2011/0061947 A1* | 3/2011 | Krah ............... G06F 1/3215 178/18.01 |
| 2011/0063993 A1* | 3/2011 | Wilson ............ G06F 3/044 370/254 |
| 2011/0096011 A1* | 4/2011 | Suzuki ..................... 345/173 |
| 2012/0001859 A1* | 1/2012 | Kim ............... G06F 3/0418 345/173 |

OTHER PUBLICATIONS

Office Action, U.S. Appl. No. 13/434,713, mailed Jul. 31, 2014, 16 pages.
Office Action Search Report for CN Application No. 201280025364.4, Mailed Sep. 21, 2015, 2 Pages.

* cited by examiner

700

```
OPERATE IN A FIRST MODE, THE FIRST MODE
COMPRISING INTERFERENCE SENSING AT A FIRST LEVEL
AND INPUT SENSING
710
```

```
SWITCH TO OPERATING IN A SECOND MODE IN
RESPONSE TO: INTERFERENCE MEASURED WHILE IN THE
FIRST MODE SATISFYING AN INTERFERENCE CONDITION;
AND A DETERMINATION THAT INPUT IS IN THE SENSING
REGION, WHEREIN, WHILE IN THE SECOND MODE,
INTERFERENCE SENSING IS EITHER NOT PERFORMED OR
ELSE PERFORMED AT A SECOND LEVEL THAT IS LOWER
IN FIDELITY THAN THE FIRST LEVEL

CAPACITIVE INPUT DEVICE INTERFERENCE DETECTION AND OPERATION

CROSS-REFERENCE TO RELATED APPLICATION

This application claims priority to the provisional patent application Ser. No. 61/476,142, by Adam Schwartz et al., entitled "INTERFERENCE DETECTION IN CAPACITIVE SENSOR DEVICES," with filing date Apr. 15, 2011, and assigned to the assignee of the present invention.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

A processing system for a capacitive input device comprises sensor circuitry and control logic. The sensor circuitry is configured to be communicatively coupled with sensor electrodes of the capacitive input device. The control logic is configured to operate the capacitive input device in a first mode comprising interference sensing at a first level and input object sensing. The control logic is also configured to operate the capacitive input device in a second mode instead of in the first mode in response to: interference measured in the first mode meeting an interference condition; and a determination that input is in a sensing region of the capacitive input device. While operating in the second mode, interference sensing with the capacitive input device is either not performed or else is performed at a second level that is lower in fidelity than the first level.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments of the present invention and, together with the Description of Embodiments, serve to explain principles discussed below, where like designations denote like elements, and:

FIGS. 7A and 7B show a flow chart of an example method of operating a capacitive input device configured to sense in a sensing region, in accordance with various embodiments.

DESCRIPTION OF EMBODIMENTS

The following Description of Embodiments is merely provided by way of example and not of limitation. Furthermore, there is no intention to be bound by any expressed or implied theory presented in the preceding technical field, background, brief summary or the following detailed description.

Overview of Discussion

Herein, various embodiments are described that provide input devices, processing systems, and methods that facilitate improved usability. In various embodiments described herein, the input device may be a capacitive input device. Embodiments associated with capacitive input device interference detection and operation, are described herein. Utilizing techniques described herein, efficiencies may be achieved by balancing noise detection and input detection operations of a capacitive input device based on various factors.

Discussion begins with a description of an example input device with which or upon which various embodiments described herein may be implemented. An example sensor electrode pattern is then described. This is followed by description of an example processing system and some components thereof. The processing system may be utilized with an input device, such as a capacitive sensing device. Operation of the capacitive input device, processing system, and components thereof are then further described in conjunction with description of various methods of operating a capacitive input device configured to sense in a sensing region.

Example Input Device

Figure 1:
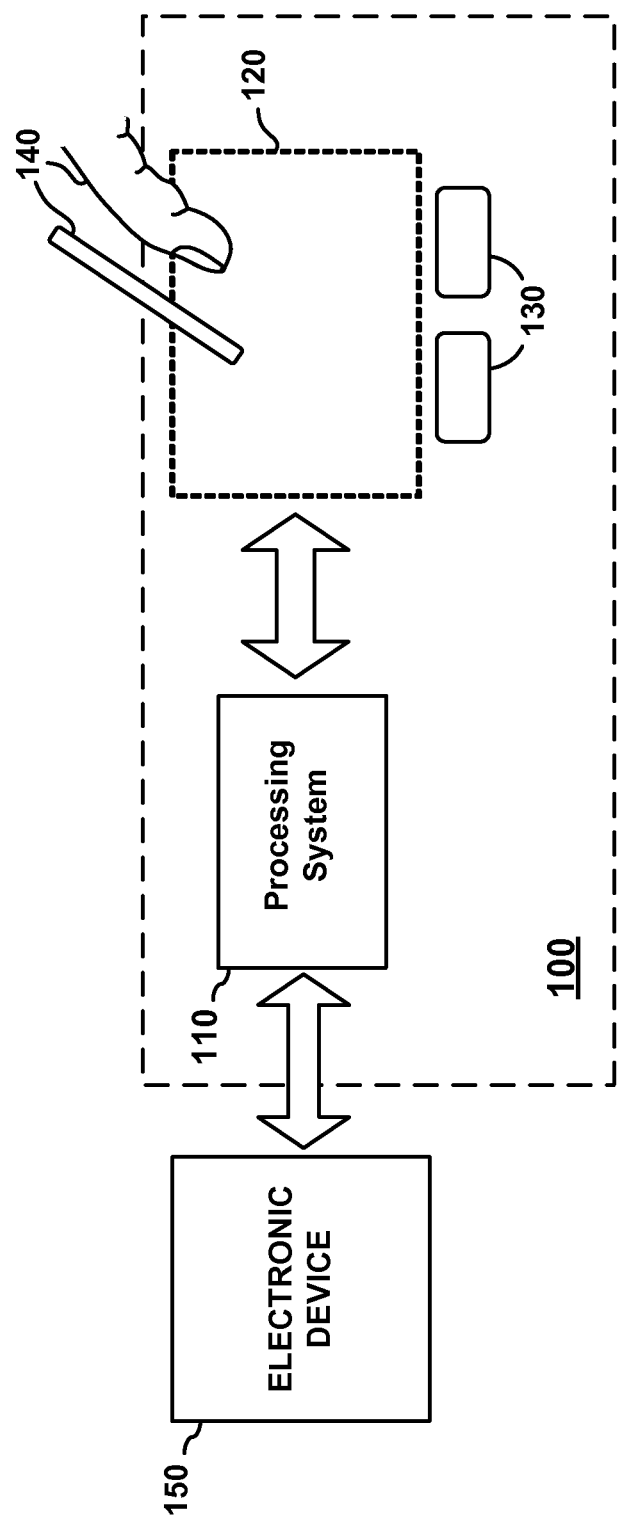
FIG. 1 is a block diagram of an example input device, in accordance with embodiments.

Turning now to the figures, FIG. 1 is a block diagram of an exemplary input device 100, in accordance with embodiments of the invention. Input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

Input device 100 can be implemented as a physical part of the electronic system, or can be physically separate from the electronic system. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of the input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in the sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. The processing system 110 is configured to operate the hardware of input device 100 to detect input in the sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100.

In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 comprises a touch screen interface, and sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Example Sensor Electrode Pattern

Figure 2:
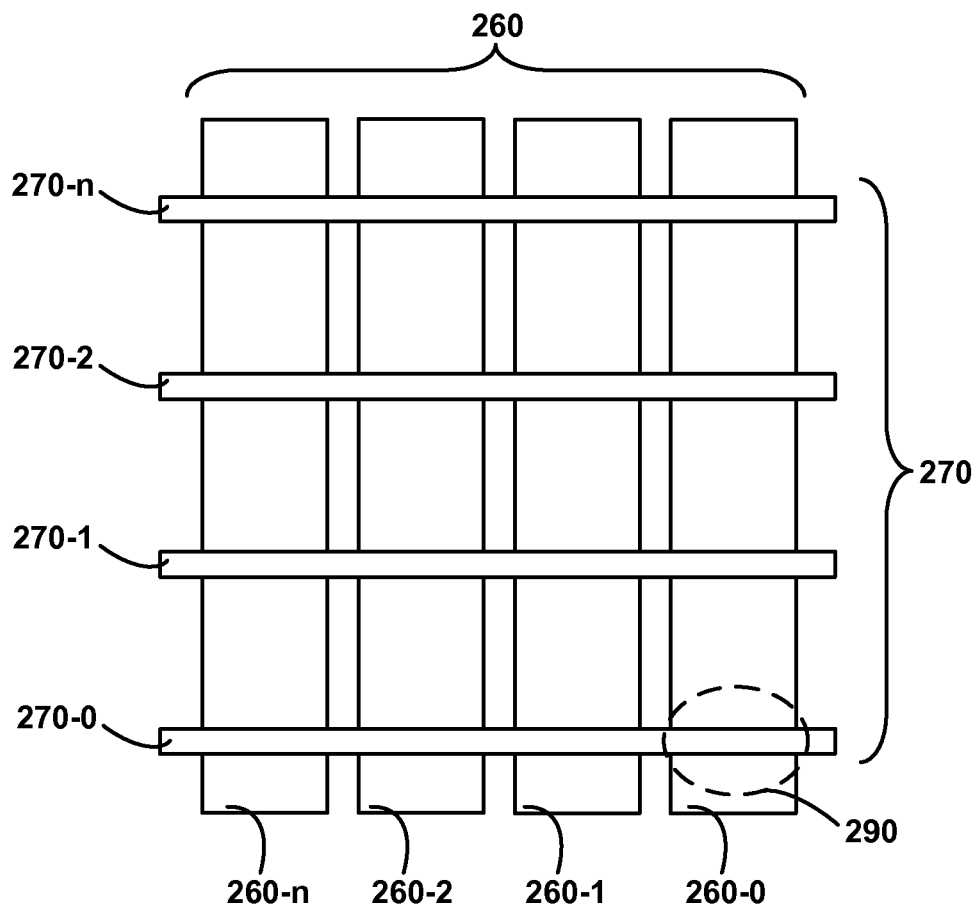
FIG. 2 shows a portion of an example sensor electrode pattern which may be utilized in a sensor to generate all or part of the sensing region of an input device, according to some embodiments.

FIG. 2 shows a portion of an example sensor electrode pattern 200 which may be utilized in a sensor to generate all or part of the sensing region of a input device 100, according to various embodiments. Input device 100 is configured as a capacitive input device when utilized with a capacitive sensor electrode pattern. For purposes of clarity of illustration and description, a non-limiting simple rectangular sensor electrode pattern 200 is illustrated. It is appreciated that numerous other sensor electrode patterns may be employed. The illustrated sensor electrode pattern is made up of a plurality of receiver electrodes 270 (270-0, 270-1, 270-2 . . . 270-n) and a plurality of transmitter electrodes 260 (260-0, 260-1, 260-2 . . . 260-n) which overlay one another, in this example. In the illustrated example, touch sensing pixels are centered at locations where transmitter and receiver electrodes cross. Capacitive pixel 290 illustrates one of the capacitive pixels generated by sensor electrode pattern 200. It is appreciated that in a crossing sensor electrode pattern, such as the illustrated example, some form of insulating material or substrate is typically disposed between transmitter electrodes 260 and receiver electrodes 270. However, in some embodiments, transmitter electrodes 260 and receiver electrodes 270 may be disposed on the same layer as one another through use of routing techniques and/or jumpers. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Capacitive pixels, such as capacitive pixel 290, are areas of localized capacitive coupling between transmitter electrodes 160 and receiver electrodes 170. The capacitive coupling between transmitter electrodes 160 and receiver electrodes 170 changes with the proximity and motion of input objects in the sensing region associated with transmitter electrodes 160 and receiver electrodes 170.

In some embodiments, sensor electrode pattern 200 is "scanned" to determine these capacitive couplings. That is, the transmitter electrodes 160 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 170 to be independently determined.

The receiver sensor electrodes 170 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The background capacitance of a sensor device is the capacitive image associated with no input object in the sensing region. The background capacitance changes with the environment and operating conditions, and may be estimated in various ways. For example, some embodiments take "baseline images" when no input object is determined to be in the sensing region, and use those baseline images as estimates of their background capacitances.

Capacitive images can be adjusted for the background capacitance of the sensor device for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

As described herein, some embodiments are configured to measure environmental interference (e.g., ambient noise) during a time when no transmitter signals are being transmitted. In this way, resulting signals received by the receiver electrodes would not contain any effects due to the transmitter signals.

Example Processing System

Figure 3:
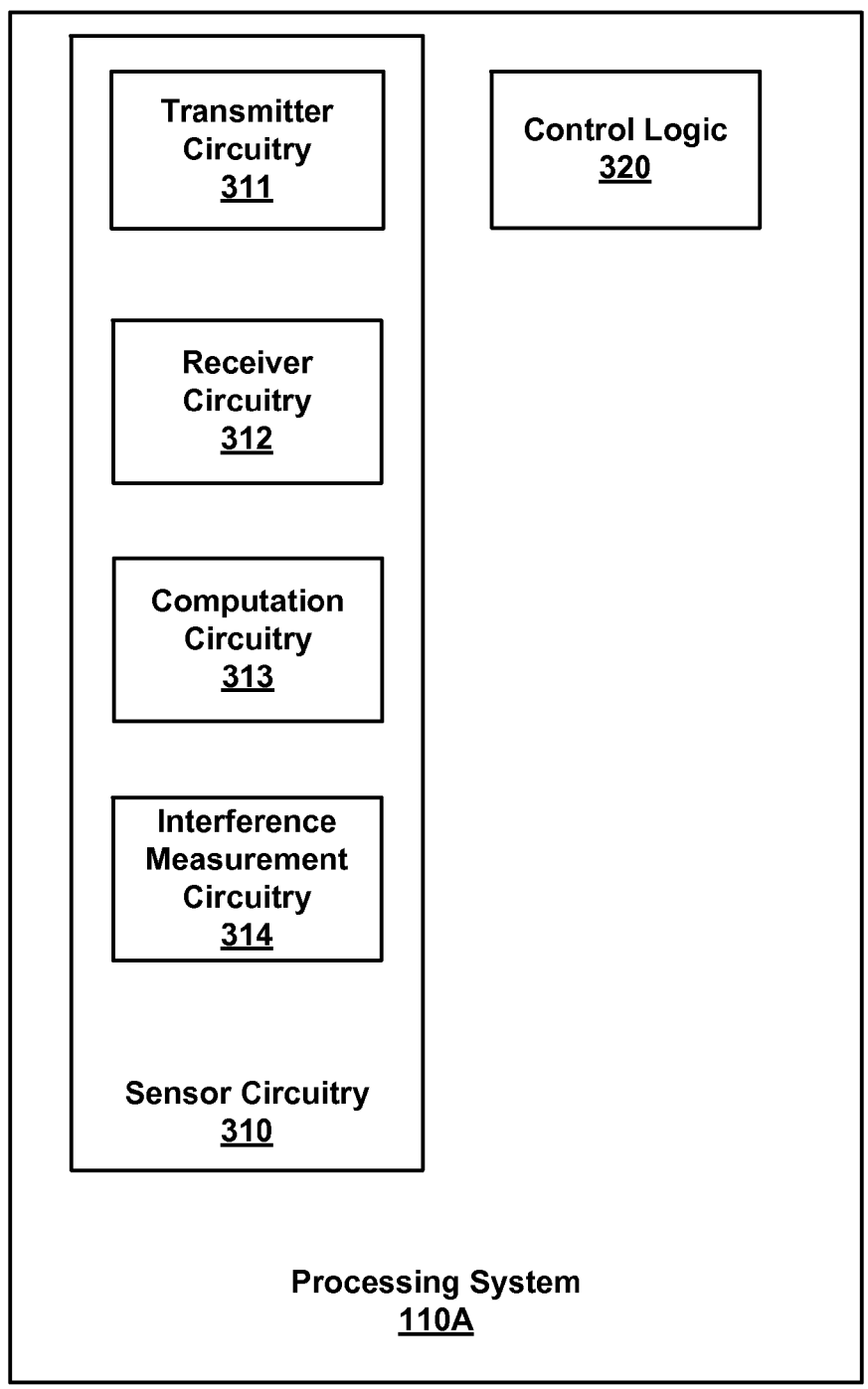
FIG. 3 illustrates an example block diagram of a processing system that may be utilized with an input device, according to various embodiments.

FIG. 3 illustrates a block diagram of some components of an example processing system 110A that may be utilized with an input device (e.g., in place of processing system 110 as part of input device 100), according to various embodiments. Processing system 110A may be implemented with one or more Application Specific Integrated Circuits (ASICSs), one or more Integrated Circuits (ICs), one or more controllers, or some combination thereof. In one embodiment, processing system 110A is communicatively coupled with one or more transmitter electrode(s) and receiver electrode(s) that implement a sensing region 120 of an input device 100. In some embodiments, processing system 110A and the input device 100, of which it is a part, may be disposed in or communicatively coupled with an electronic device 150, such as a display device, computer, or other electronic device.

In one embodiment, of input device 100, processing system 110A includes, among other components: sensor circuitry 310, and control logic 320. Processing system 110A and/or components thereof may be coupled with sensor electrodes of a sensor electrode pattern, such as sensor electrode pattern 200. For example, sensor circuitry 310 is coupled with one or more sensor electrodes of a sensor electrode pattern (e.g., sensor electrode pattern 200) of input device 100.

Sensor circuitry 310 operates to interact with receiver and transmitter sensor electrodes of a sensor pattern that is utilized to generate a sensing region 120. This includes operating transmitter electrodes to be silent or transmit a transmitter signal. This also includes utilizing receiver sensor electrodes to receive resulting signals and other signals which may be interference. Sensor circuitry 310 may also determine from received resulting signal(s) that an input has occurred in sensing region 120, as well as determining a location of the input with respect to sensing region 120. Sensor circuitry 310 may further determine that interference is occurring and/or determine the nature of the interference. As depicted in FIG. 3, sensor circuitry 310 may include one or more of transmitter circuitry 311, receiver circuitry 312, computation circuitry 313, and interference measurement circuitry 314.

Transmitter circuitry 311 operates to transmit transmitter signals on one or more transmitter electrodes 160. In a given time interval, transmitter circuitry 311 may transmit or not transmit a transmitter signal (waveform) on one or more of a plurality of transmitter electrodes 160. Transmitter circuitry 311 may also be utilized to couple one or more transmitter electrodes 160 (and respective transmitter path(s)) of a plurality of transmitter electrodes 160 to high impedance, ground, or to a constant voltage when not transmitting a waveform on such transmitter electrodes. The transmitter signal may be a square wave, trapezoidal wave, or some other waveform. Transmitter circuitry 311 may code a transmitter signal, such as in a code division multiplexing scheme. The code may be altered, such as lengthening or shortening the code, under direction of control logic 320. Lengthening the code is one technique for avoiding interference.

Receiver circuitry 312 operates to receive resulting signals, via receiver electrodes. The received resulting signals correspond to and include some version of the transmitter signal(s) transmitted via the transmitter electrodes. These transmitted transmitter signals however, may be altered or changed in the resulting signal due to stray capacitance, noise, interference, and/or circuit imperfections among other factors, and thus may differ slightly or greatly from their transmitted versions. To avoid interference, receiver circuitry 312 may be equipped to implement one or more filtering operations, which may include utilizing either or both of linear and non-linear filtering techniques. As will be further described herein, filtering operations may be implemented, not implemented, and/or modified under direction of control logic 320. Resulting signals may be received on one or a plurality of receiver electrodes during a time interval. Receiver circuitry 312 includes a plurality of amplifiers, typically one per receiver electrode. Such amplifiers may be referred to herein as amplifiers, front-end amplifiers, integrating amplifiers, or the like, and receive a reference voltage at a first input and a resulting signal at a second input. The resulting signal is from a receiver electrode of a capacitive sensor device.

Computation circuitry 313 operates to compute/determine a measurement of a change in a capacitive coupling between a transmitter electrode and a receiver electrode. Computation circuitry then uses this measurement to determine the position of an input object (if any) with respect to sensing region 120.

Interference measurement circuitry 314 operates to measure when and to what extent interference is occurring. This can comprise actively sensing for and measuring interference using receiver sensor electrodes or sensing the effects of interference. Active sensing for and measuring of interference can occur when one or more transmitter electrodes are transmitting or can occur when transmitter electrodes are not transmitting (this can include simply not transmitting or additionally being coupled to a high impedance). Typically, such active sensing for and measuring interference takes up time that might otherwise be used for sensing for an actual input from an input object. Effects which indicate interference is occurring include difficulty or impossibility of receiver circuitry 312 sensing a resulting signal when transmitter electrodes are transmitting, and receiver circuitry 312 experiencing corruption of a received resulting signal (e.g., garbled code or input object position oddities such as an input object appearing to jump back and forth quickly in the sensing region). In some embodiments, when interference is measured during periods when the transmitter electrodes are not being driven by a transmitter signal, interference can be measured directly from the receiver signal which would otherwise be quiet in the absence of interference. Many of the types of effects of interference can be measured passively. Interference measurement circuitry 314 may communicate information about interference determinations to control logic 320 and, under direction of control logic 320, may also alter one or more aspects of how measuring interference takes place.

Control logic 320 comprises decision making logic which directs processing system 110A and sensor circuitry 310 to operate in a selected one of a plurality of different operating modes based on various inputs. Some non-limiting examples of such inputs include one or more measurement(s) of interference and/or indication of an input being sensed or not sensed in sensing region 120 of input device 100. Control logic may be implemented as hardware (e.g., hardware logic and/or other circuitry) and/or as a combination of hardware and instructions stored in a non-transitory manner in a computer readable storage medium.

Discussion of Capacitive Input Device Interference Sources

Typically a capacitive input device suffers from two distinct types of interference: noise interference that is present without a finger (or other object) touching or otherwise in proximity to the capacitive input device in the input region and noise interference that is only present when a finger (or other object) is touching or otherwise in proximity to the input device in the input region.

The first case is associated with noise interference from electronic devices in proximity to the capacitive input device. For instance, back-coupled noise from an LCD underneath a sensor electrode pattern is a common source of noise interference. Such interference sources are often stationary in the sense that their frequency components are fairly constant over time.

The second case can arise when noise interference in the environment of the input device is coupled into the sensor from an input object. This is often referred to as "input object coupled interference." The second case can also happen when interference from a power supply charger causes the potential of a sensor electrode pattern (or one or more sensors thereof) to vary with respect to earth ground and an input object which is coupled to earth ground touches the input device. In either case, the conventional strategy is to try to quickly detect input object coupled interference and respond appropriately.

There are conventionally two classes of firmware algorithms which have been proposed to detect input object coupled interference. In one approach, a linear or nonlinear filtering operation is performed on the capacitance measurements that are received from receiver electrodes. The filtering is intended to separate a desired input object signal component from the undesired interference component. This approach has several shortcomings with regard to accurate hypothesis testing (i.e., determining whether the signal represents an input object or interference). In a second approach, a dedicated portion of each frame of scanning a sensor electrode pattern of the input device is spent measuring noise with the transmitters turned off. When the transmitters are turned off, the input object signal is absent and the interference component is much more easily detected. Although this second approach leads to accurate interference detection, it uses up time which could otherwise be used for input object detection and thus either reduces the frame rate with which sensor electrode pattern is scanned or else reduces the SNR. This can be particularly unfortunate in the case of large sensors electrode patterns which have slow sensor settling times and many transmitters electrodes to scan through when transmitting a signal. Such large sensor electrode patterns therefore cannot easily afford the extra time required for dedicated noise scanning during a large portion of the scanning frame.

The approach for operating a capacitive input device that is taken herein relies upon two observations: 1) input object coupled interference is only present when an input object is present and somehow interacting with the input device; and 2) if there is input object coupled interference, it is present during the entire time the input object is touching the capacitive input device in the sensing region.

In particular, observation number two suggests that if there is an interferer it will be present when the input object first touches the input device in the sensing region. The converse is also true: if the interference is not present when the input object first touches the input device in the sensing region, it will not spontaneously appear during the time the input object remains in contact within the sensing region of the input device.

Because of these observations described herein, it is therefore sufficient to check for input object coupled noise only up until the time an input object is detected. Once the input object is detected, if an interference condition is met (for example an interference threshold not being exceeded or interference heuristic(s) not occurring, thus indicating that interference is not considered to be too high), it is no longer necessary to spend any time detecting input object coupled interference so long as the input object is in continued contact with the input device in the sensing region.

Example Methods of Operation

Figure 4:
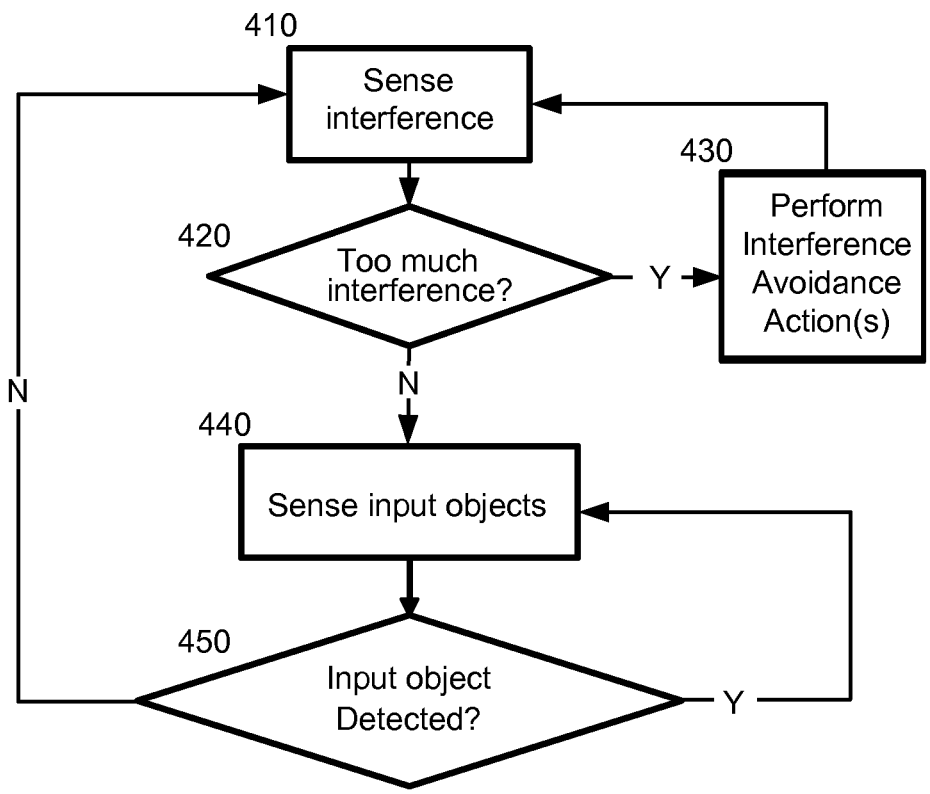
FIGS. 4-6 show flow charts of an example methods of operating a capacitive input device configured to sense in a sensing region, in accordance with various embodiments.

FIG. 4 shows a flow chart 400 for an example method of operating a capacitive input device that is configured to sense in a sensing region, according to various embodiments. In the method illustrated by flow chart 400, noise detection will not suffer from false positives induced from input object signals, nor will the frame rate or signal to noise ration suffer from dedicating a portion of normal frame processing to noise processing.

In procedure 410, the transmitters are not transmitting transmitter signals, and interference is sensed. For example, control logic 320 may instruct transmitter circuitry 311 not to transmit on transmitters of capacitive input device 100. While the transmitters are not transmitting, the receivers of capacitive input device 100 can be used to sense any interference that is present.

In procedure 420, the interference measurement circuitry 314 measures interference and based on these measurements control logic 320 determines if the interference is too high using appropriate criteria. For example, control logic 320 determines if an interference condition indicative of the interference being within acceptable bounds has been met. This determination can be made in various manners, such as by comparison with one or more interference thresholds, analysis of various heuristics associated with the interference, and/or other technique(s). If the interference condition is not met, then interference is deemed to be too high for acceptable conduct of input sensing. In procedure 420, the determination by control logic 320 as to whether or not an interference condition has been met additionally or alternatively may involve one or more of detecting the power associated with the interference using a power detector (such as a square-law detector), filtering the interference signal (such as with a sum of absolute differences), or other interference determining techniques.

If the interference condition has not been met, and the interference is deemed be too high, then control logic 320 instructs sensor circuitry 310 to perform one or more interference avoidance actions in procedure 430 and the system returns to procedure 410 after the interference avoidance action(s) have been performed. Some non-limiting examples of corrective actions that may be taken in procedure 430 include changing a sensing frequency, changing an order of filters applied, changing the frequency response(s) of the filter(s) used, lowering the capacitive frame rate, etc.

If the interference condition is met, and thus the interference is not considered to be too high, then control logic 320 instructs transmitter circuitry 311 to transmit transmitter signals and the capacitive input device 100 scans for input(s) in sensing region in procedure 440.

Computation circuitry 313 determines if an input from an input object has been detected in procedure 450. This determination can be accomplished in any appropriate way. For example, processing system 110A may use only the signals just acquired in procedure 440, use the signals just acquired in procedure 440 along with signals acquired in earlier performances of procedure 440, etc. As another example, the computation circuitry 313 of processing system 110A may use some or all of the signals acquired in any performance of procedure 440. If one or more inputs are detected, then the processing system 110A loops back to procedure 440. In one embodiment, when no input(s) are detected, then processing system 110A returns from procedure 450 to procedure 410. This is illustrated in flow chart 400 by the return loop between procedure 450 and procedure 410 that occurs in response to an input object not being detected.

Many variations of the procedures illustrated in flow chart 400 are possible. Various embodiments may have additional procedures, fewer procedures, or other procedures those shown by flow chart 400. Embodiments may also have different ordering of the procedures. For example, some embodiments may be configured to sense input from input objects before finishing a determination of whether the interference condition. In such a case, the scanning for input objects may occur in parallel with processing for evaluating the amount of interference, and procedures such as taking an interference avoidance action may be linked differently with other procedures.

Figure 5:
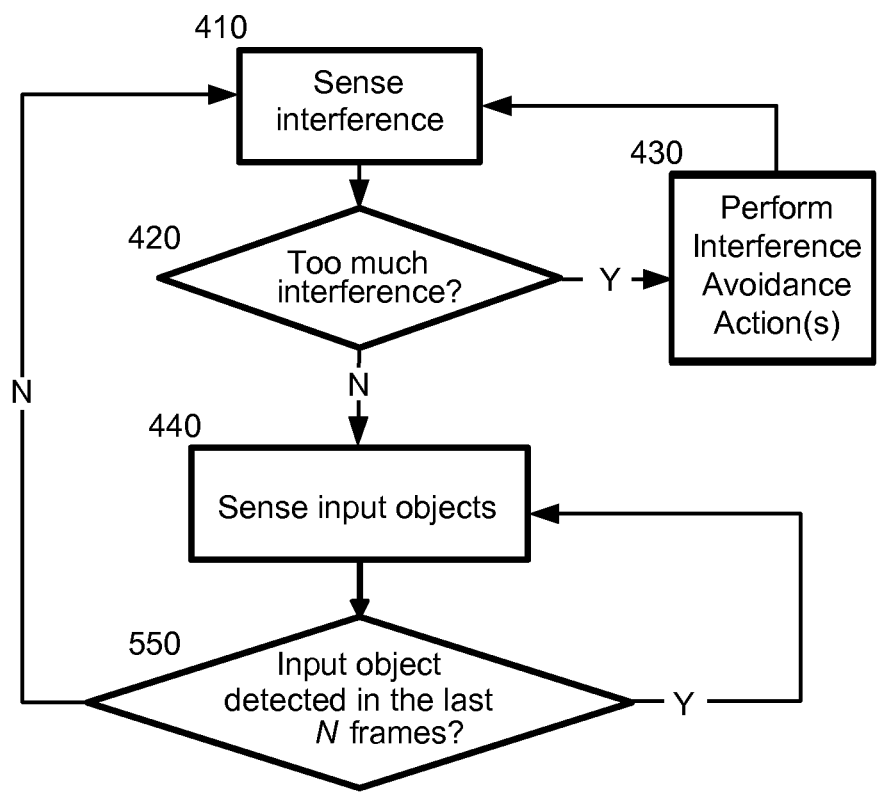

FIG. 5 shows a flow chart 500 for an example method of operating a capacitive input device that is configured to sense in a sensing region, according to various embodiments. Flow chart 500 illustrates a variation on the method illustrated in flow chart 400. For example, flow chart 500 illustrates detection of an input object (in procedure 550) based on the last N frames. Procedures 410-440 of flow chart 500 are analogous to procedures 410-440 of flow chart 400, while procedure 550 is a variation of procedure 450

Procedure 550 varies from procedure 450 by being configured to determine if an input associated with an input object was sensed in sensing region 120 for the last frame acquired, for a selected number of frames acquired, for the last N frames acquired, within a certain time period, etc. In one embodiment, when no input(s) are detected in the last N frames, then processing system 110A returns from procedure 550 to procedure 410. This is illustrated in flow chart 500 by the return loop between procedure 550 and procedure 410 that occurs in response to an input object not being detected in the last N frames. In one embodiment, control logic 320 makes the determination. Where the determination is based on a shorter time period/fewer and more recent frames, transition from procedure 550 to procedure 410 is generally more immediate and very similar to the change between procedures 450 and 410 of flow chart 400. Where the determination is based on history (e.g., a longer time period; select frames from a time period prior to the current time; or including or not including the most recent sample, such as the last N frames where N>1), processing system 110A generally changes from procedure 550 to procedure 410 more slowly than the change from procedure 450 to procedure 410. The change is slower because processing system 110A generally does not immediately start sensing interference in response to a determination of no input objects in the sensing region 110. Both approaches have advantages. For example, processing systems 100A with input object detection periods in procedure 550 that are based on history may be more efficient in sensing and processing some gestures involving multiple sequential taps by input objects, as noise detection does not immediately begin after an input object is lifted. For example, fast finger traps are processed more efficiently after the first tap is detected if N>1.

As another example of variation, some embodiments are configured to sense interference even if input object(s) are detected in the sensing region, at a slower rate than if no input object(s) are detected in the sensing region. For example, some embodiments are configured to sense interference every M frames when input object(s) are detected in the sensing region. As a further example, some embodiments are configured to sense interference in response to a determination that the input object data acquired meets or does not meet some criteria or additional interference condition (e.g., received resulting signals appear corrupted because of input object position oddities, such as an input object appearing to jump back and forth quickly in the sensing region, sensor circuitry detecting non-linearity conditions). As yet another example of variation, various embodiments may sense interference if the input(s) detected in the sensing region are determined to have changed (e.g., input(s) added and/or removed).

It should be appreciated that there is a choice for how to implement the timing of the sensing of procedures 410 and 440. One option is to choose timing so that procedure 440 has the desired frame rate when an input object is present but additional time is allowed for noise detection when no input object is present. In this case there will be a slight increase in latency in detecting an input object. For instance, if the input object processing frame rate is 100 Hz and an additional 25% of time is spent on noise detection, then the input object detection latency can increase by 2.5 mS. However, once an input object is detected, the frame rate reaches its full rate. In the second case a lesser amount of time is spent in procedure 440 when no input object is present such that the frame rate is the same whether or not noise detection is active. In this case there might be a slight decrease in position accuracy for the initial input object position and some complications can be incurred because the filter settling will be different in the sensing carried out in procedures 410 and 440.

Figure 6:
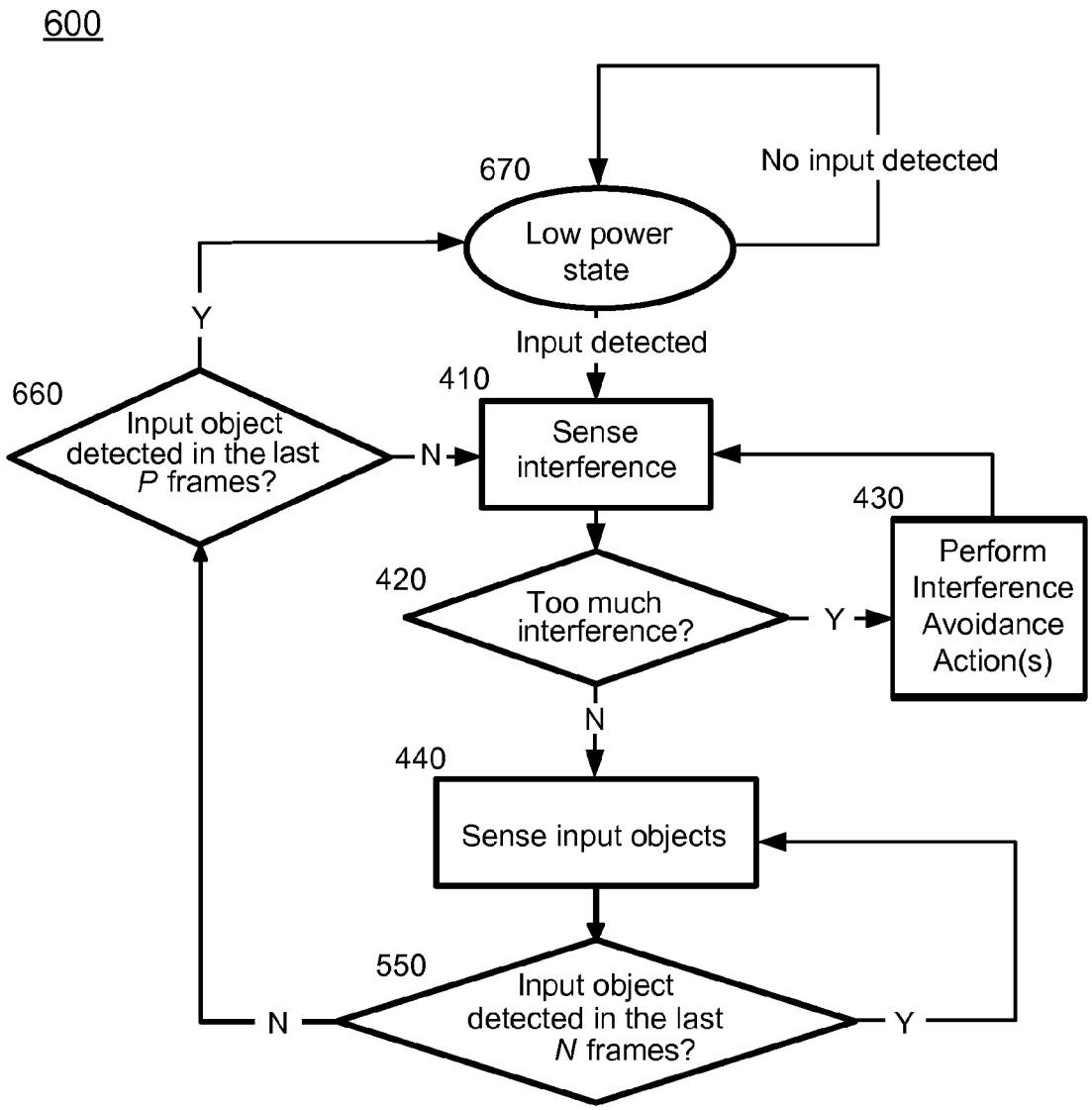

FIG. 6 shows a flow chart 600 for an example method of operating a capacitive input device that is configured to sense in a sensing region, according to various embodiments. Flow chart 600 illustrates some example variations and adaptations on the method illustrated in flow chart 500. In flow chart 600, procedures 410-440 and 550 are analogous to procedures 410-440 and 550 of flow chart 500. In flow chart 600, in response to no input being detected in the sensing region during the last N frames (where N may equal 1), control logic 320 checks in procedure 660 if P frames have passed since input objects have been deleted (where P is greater or equal to N). If input has been detected in the last P frames, then control logic 320 returns processing system 110A to procedure 410 and directs processing system 110A to sense interference. If no input has been detected in the last P frames, then control logic 320 causes processing system 110A and input device 100 to enter a low power state in procedure 670 (e.g., a sleep mode where power utilized by capacitive input device 100 is lower than in normal operation of capacitive input device 100). In this low power state, processing system 110A may be configured by control logic 320 to periodically sense for input in sensing region 120 using any appropriate method. In response to sensing such input, control logic 320 may direct processing system 110A to procedure 410. Where P equals N, procedures 550 and 660 may collapse into the same procedure.

Some embodiments are configured to acquire full capacitive frames at the same fidelity regardless of whether or not input from one or more input objects is determined to be in sensing region 120. This may be done by control logic 320 directing sensor circuitry 310 to vary the frame rate. For example, if input associated with one or more input objects is detected in sensing region 120 in a previous frame (or recent history), control logic 320 directs sensor circuitry 310 to spend little or no time on sensing interference (this is in accordance with the two observations described above); thus, input device 100 senses for inputs associated with input objects at a higher capacitive frame rate. In contrast, if no input objects are determined to be in the sensing region in a previous frame (or recent history), these control logic 320 directs sensor circuitry 310 to spend more time on sensing interference, and thus input device 100 senses for input objects at a lower capacitive frame rate. Herein, the term "frame rate" refers to the capacitive frame rate and represents how often new object detection reports are provided by the processing system 110A. Part of a frame may be dedicated to touch sensing and part may be dedicated to noise or interference detection.

In some embodiments, control logic 320 directs sensor circuitry 310 to sense at the same capacitive frame rate regardless of if input objects are determined to be in the sensing region. This may be accomplished in various ways. For example, in some embodiments sensor circuitry 310 is directed to acquire full capacitive frames (at full fidelity) if input(s) associated with one or more input objects is determined to be in sensing region 120, and to acquire less than full capacitive frames (at less than full fidelity) if no input associated with an input object is determined to be in sensing region 120. As another example, in some embodiments control logic 320 may direct sensor circuitry 310 to spend more time per scan if input(s) associated with one or more input objects is determined to be in sensing region 120, and spend less time per scan if no input associated with an input object is determined to be in sensing region 120. However, it should be noted that by reducing the scan time, control logic 320 may increase error (e.g., reduce the amount of time for settling). The potential for increased error due to decreased settling time is somewhat unique to the sensor electrode pattern being utilized, and thus needs to be factored in to any reduction in scan time for a particular sensor electrode pattern.

In some embodiments, control logic 320 is configured to direct sensor circuitry 310 to change both the capacitive frame rate and the sensing fidelity in response to input associated with an input object being detected in sensing region 120.

Figure 7B:
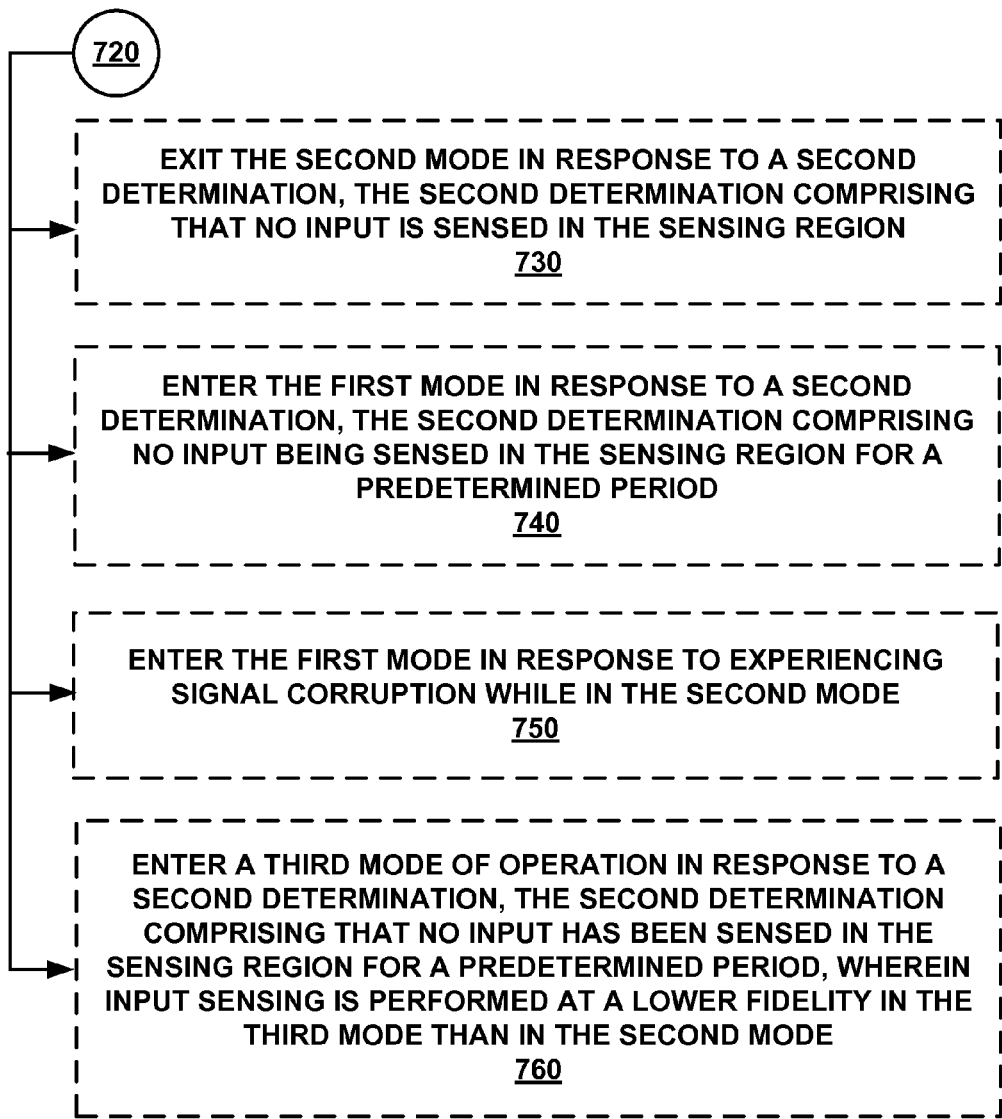

FIGS. 7A and 7B illustrate a flow chart 700 of methods of operating a capacitive input device configured to sense in a sensing region, in accordance with various embodiments. For purposes of illustration, during the description of flow chart 700, reference will be made to components of input device 100 of FIG. 1, sensor electrodes of FIG. 2, components of processing system 110A that are illustrated in FIG. 3, and procedures illustrated in flow charts 400, 500, and 600. In some embodiments, not all of the procedures described in flow chart 700 are implemented. In some embodiments, other procedures in addition to those described may be implemented. In some embodiments, procedures described in flow chart 700 may be implemented in a different order than illustrated and/or described.

At 710 of flow chart 700, in one embodiment, capacitive input device 100 is operated in a first mode. For example, control logic 320 may direct sensor circuitry 310 to operate in this first mode. Operation in this first mode is described in conjunction with procedures 410 and 420 of flow charts 400, 500, and 600. The first mode comprises interference sensing at a first level and also comprises input sensing. The first mode may comprise control logic 320 directing sensor circuitry 310 to utilize a first frame rate in which a certain portion of a frame is dedicated to interference sensing and a certain portion of a frame is dedicated to input sensing. In one embodiment, control logic 320 directs that some or all of the interference sensing performed in the first mode of operation is performed with transmitter electrodes of capacitive input device 100 in a non-transmitting state.

While in this first mode of operation, if interference is sensed which does not meet an interference condition (and is thus considered too high) one or more interference avoidance actions may be implemented. Conduct of this interference avoidance while in the first mode of operation is described in procedure 430 of flow charts 400, 500, and 600. Some non-limiting examples of interference avoidance actions which may be implemented alone or in various combinations include: modifying a sensing frequency, modifying a filtering operation, increasing a code length utilized in a code division multiplexing sensing scheme, and implementing a non-linear filtering technique. It is also possible to increase overall signal quality by lowering the frame rate.

At 720 of flow chart 700, in one embodiment, the capacitive input device is switched to operating in a second mode, rather than in the first mode. This second mode and switching to this second mode are described in procedures 420 and 440 of flow charts 400, 500, and 600. Control logic 320, in one embodiment, directs sensor circuitry 310 to operate in the second mode. The switch to the second mode occurs in response to two conditions occurring. The first condition is that interference measured with capacitive input device 100 while in the first mode has met an interference condition, and is thus deemed not to be too high for effective input sensing. The second condition is a determination that an input is in the sensing region of capacitive input device 100. While in the second mode, interference sensing with capacitive input device 100 is either not performed or else is performed at a second level that is lower in fidelity than the first level of interference sensing. The lower fidelity may be due to a variety of factors. Some non-limiting examples of such factors include: different interference detection techniques being utilized, alteration of the frame rate, and a smaller portion of a frame being dedicated to interference sensing that the portion which is utilized for interference sensing in the first mode.

At 730 of flow chart 700, in one embodiment, the method as described in 710 and 720 further includes exiting the second mode in response to a second determination, where the second determination comprises determining that no input is sensed in sensing region 120. This second determination is described in procedure 450 of flow chart 400 and in a modified fashion in procedure 550 of flow charts 500 and 600. In one embodiment, control logic utilizes information from computation circuitry 313 to make this second determination and direct that sensor circuitry 310 exit the second mode.

At 740 of flow chart 700, in one embodiment, the method as described in 710 and 720 further includes entering the first mode in response to a second determination, where the second determination comprises determining that no input is sensed in sensing region 120. This second determination is described in procedure 450 of flow chart 400 and in a modified fashion in procedure 550 of flow charts 500 and 600. In one embodiment, control logic 320 utilizes information from computation circuitry 313 to make this second determination and direct that sensor circuitry 310 exit the second mode and enter the first mode. This entry into the first mode can be an initial entry into the first mode of operation or can be an exit from another mode of operation, such as the second mode, and a re-entry into the first mode of operation.

At 750 of flow chart 700, in one embodiment, the method as described in 710 and 720 further includes entering the first mode in response to experiencing signal corruption while in the second mode. This corruption detection is described above as an aspect of procedures 550 of flow charts 500 and 600. In one embodiment, control logic 320 utilizes information from computation circuitry 313 to determine if signal corruption is occurring and thus that the second mode should be exited and the first mode should be entered. This entry into the first mode can be an initial entry into the first mode of operation or can be an exit from another mode of operation, such as the second mode, and a re-entry into the first mode of operation.

At 760 of flow chart 700, in one embodiment, the method as described in 710 and 720 further includes entering a third mode of operation in response to a second determination. This third mode and the second determination are described above in conjunction with description of procedures 550, 660, and 670 of flow chart 600. The second determination is made by control logic 320, in some embodiments, and comprises a determination that no input has been sensed in sensing region 120 for a predetermined period. The period may be a period of time or a number of frames of capacitive input device 100. In this third mode input sensing is performed at a lower fidelity than in the second mode. The lower fidelity may be as a result of one or more factors. Some of the factors that may result in lower fidelity include, but are not limited to: using fewer sensor electrodes, sensing less frequently, and using a smaller segment of a frame for conducting input sensing.

In one embodiment, the third mode is exited and the first mode is entered in response to a third determination. This third determination is made, in one embodiment, by control logic 230 based on input from computation circuitry 313. The third determination comprises input being sensed in sensing region 120 while in capacitive input device 100 is operating in the third mode. This shift from the third, low power mode, back to the first mode is illustrated in transition from procedure 670 to procedure 410 in flow chart 600.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system for a capacitive input device, said processing system comprising:
   sensor circuitry configured to be communicatively coupled with sensor electrodes of said capacitive input device; and
   a processor configured to:
     operate said capacitive input device in a first mode comprising transmitting with a subset of said sensor electrodes to perform capacitive sensing during a portion of a capacitive sensing frame that is dedicated to input object sensing and during another portion of said capacitive sensing frame to perform interference sensing at a first level with said sensor electrodes;

cease said first mode of operation and operate said capacitive input device in a second mode instead of in said first mode in response to:

interference measured in said first mode meeting an interference condition indicative of being within acceptable bounds for input sensing; and a determination that input is in a sensing region of said capacitive input device, wherein, while in said second mode input object sensing is performed in said capacitive sensing frame, but interference sensing is not performed in said capacitive sensing frame; and return from said second mode of operation to said first mode of operation in response to experiencing signal corruption while performing input object sensing during said second mode of operation.

2. The processing system of claim 1, wherein the processor is further configured to:

exit said second mode in response to a second determination while in said second mode that no input is in said sensing region.

3. The processing system of claim 1, wherein the processor is further configured to:

enter said first mode in response to a second determination that no input has been sensed in said sensing region for a predetermined period.

4. The processing system of claim 1, wherein the processor is further configured to:

operate said capacitive input device in a third mode in response to a second determination, said second determination comprising that no input has been sensed in said sensing region for a predetermined period, wherein input sensing is performed at a lower fidelity in said third mode than in said first mode.

5. The processing system of claim 4, wherein the processor is further configured to:

operate said capacitive input device in said first mode in response to a third determination, said third determination comprising input being sensed in said sensing region while in said third mode.

6. The processing system of claim 1, wherein the processor is further configured to:

implement an interference avoidance action while in said first mode in response to said interference condition not being met.

7. The processing system of claim 6, wherein said interference avoidance action is selected from the group of interference avoidance actions consisting of: modifying a sensing frequency, modifying a filtering operation, increasing a code length utilized in a code division multiplexing sensing scheme, and implementing a non-linear filtering technique.

8. The processing system of claim 1, wherein interference sensing at a first level comprises:

interference sensing with transmitter electrodes of said capacitive input device in a non-transmitting state.

9. A capacitive input device comprising:

a plurality of sensor electrodes; and a processing system coupled with said plurality of plurality of sensor electrodes, said processing system configured to:

operate said capacitive input device in a first mode comprising transmitting with a subset of said plurality of sensor electrodes to perform capacitive sensing during a portion of a capacitive sensing frame that is dedicated to input object sensing and during another portion of said capacitive sensing frame to perform interference sensing at a first level with said plurality of sensor electrodes;

cease said first mode of operation and operate said capacitive input device in a second mode instead of in said first mode in response to:

interference measured in said first mode meeting an interference condition indicative of being within acceptable bounds for input sensing; and a determination that input is in a sensing region of said capacitive input device, wherein, while in said second mode input object sensing is performed in said capacitive sensing frame, but interference sensing is not performed in said capacitive sensing frame, and return from said second mode of operation to said first mode of operation in response to experiencing signal corruption while performing input object sensing during said second mode of operation.

10. The capacitive input device of claim 9, wherein said processing system is further configured to:

exit said second mode in response to a second determination while in said second mode that no input is in said sensing region.

11. The capacitive input device of claim 9, wherein said processing system is further configured to:

enter said first mode in response to a second determination that no input has been sensed in said sensing region for a predetermined period.

12. The capacitive input device of claim 9, wherein said processing system is further configured to:

operate said capacitive input device in a third mode in response to a second determination, said second determination comprising that no input has been sensed in said sensing region for a predetermined period, wherein input sensing is performed at a lower fidelity in said third mode than in said first mode.

13. The capacitive input device of claim 12, wherein said processing system is further configured to:

enter said first mode in response to a third determination, said third determination comprising input being sensed in said sensing region while in said third mode.

14. A method of operating a capacitive input device configured to sense in a sensing region, said method comprising:

operating said capacitive input device in a first mode comprising transmitting with a subset of sensor electrodes to perform capacitive sensing during a portion of a capacitive sensing frame that is dedicated to input object sensing and during another portion of said capacitive sensing frame to perform interference sensing at a first level with said sensor electrodes ceasing said first mode of operation and switching to operating in a second mode in response to:

interference measured while in said first mode satisfying an interference condition indicative of being within acceptable bounds for input sensing; and a determination that input is in said sensing region, wherein, while in said second mode, interference sensing is performed at a second level that is lower in fidelity than said first level, and input object sensing is performed in said capacitive sensing frame; and returning from said second mode of operation to said first mode of operation in response to experiencing signal corruption while performing input object sensing during said second mode of operation.

15. The method as recited in claim 14, further comprising:
exiting said second mode in response to a second determination, said second determination comprising that no input is sensed in said sensing region.

16. The method as recited in claim 14, further comprising:
entering said first mode in response to a second determination, said second determination comprising no input being sensed in said sensing region for a predetermined period.

17. The method as recited in claim 14, further comprising:
entering a third mode of operation in response to a second determination, said second determination comprising that no input has been sensed in said sensing region for a predetermined period, wherein input sensing is performed at a lower fidelity in said third mode than in said second mode.

18. The method as recited in claim 17, further comprising:
entering said first mode in response to a third determination, said third determination comprising input being sensed in said sensing region while in said third mode.

19. The method as recited in claim 14, wherein said operating in a first mode comprises:
implementing an interference avoidance action selected from the group of interference avoidance actions consisting of: modifying a sensing frequency, modifying a filtering operation, increasing a code length utilized in a code division multiplexing sensing scheme, and implementing a non-linear filtering technique.

20. The method as recited in claim 14, wherein said operating in a first mode comprising interference sensing at a first level comprises:
performing said interference sensing at said first level with transmitter electrodes of said capacitive input device in a non-transmitting state.

* * * * *